(12) United States Patent
Watson

(10) Patent No.: US 6,737,993 B2
(45) Date of Patent: May 18, 2004

(54) METHOD AND APPARATUS FOR RUN-LENGTH ENCODING DATA VALUES

(75) Inventor: Victor Robert Watson, Southhampton (GB)

(73) Assignee: STMicroelectronics Limited, Almondsbury (GB)

( * ) Notice: Subject to any disclaimer, the term of this patent is extended or adjusted under 35 U.S.C. 154(b) by 0 days.

(21) Appl. No.: 10/143,542

(22) Filed: May 10, 2002

(65) Prior Publication Data

US 2003/0137437 A1 Jul. 24, 2003

(Under 37 CFR 1.47)

Related U.S. Application Data

(63) Continuation of application No. 10/012,222, filed on Dec. 6, 2001, now abandoned, which is a continuation of application No. 09/874,920, filed on Jun. 5, 2001, now abandoned, which is a continuation of application No. 09/685,253, filed on Oct. 10, 2000, now abandoned, which is a continuation of application No. 09/498,301, filed on Feb. 4, 2000, now abandoned, which is a continuation of application No. 09/350,622, filed on Jul. 9, 1999, now abandoned, which is a continuation of application No. 09/207,208, filed on Dec. 8, 1998, now abandoned.

(30) Foreign Application Priority Data

Dec. 29, 1997 (GB) .............................................. 9727398

(51) Int. Cl.[7] ................................................ H03M 7/00

(52) U.S. Cl. .............................. 341/59; 341/63; 341/67

(58) Field of Search ............................. 341/59, 51, 55, 341/63, 67

(56) References Cited

U.S. PATENT DOCUMENTS

| 3,935,379 | A | | 1/1976 | Thornburg et al. | |
|---|---|---|---|---|---|
| 4,488,143 | A | * | 12/1984 | Martin | 341/59 |
| 4,494,151 | A | | 1/1985 | Liao | |
| 5,302,949 | A | * | 4/1994 | Yoshinari et al. | 341/67 |
| 5,574,448 | A | * | 11/1996 | Weng et al. | 341/59 |
| 5,751,232 | A | * | 5/1998 | Inoue et al. | 341/59 |

OTHER PUBLICATIONS

Standard Search Report dated Mar. 16, 1998, issued by the European Patent Office.
Ruby Lee, Subword Parallelism with MAX–2, IEEE Micro, vol. 16, No. 4, Aug. 1, 1996, pp. 51–59 XP000596513.

* cited by examiner

Primary Examiner—Michael Tokar
Assistant Examiner—Lam Mai
(74) Attorney, Agent, or Firm—Lisa K. Jorgenson; James H. Morris; Wolf, Greenfield & Sacks, P.C.

(57) ABSTRACT

A method for run-length encoding two or more data values, the method comprising: loading the data values into storage by forming a first data string, the data string comprising a plurality of data sub-strings and each data sub-string representing at least one of the data values; generating a second data string having a data sub-string corresponding to each data sub-string of the first data string, all the bits of each of the data sub-strings of the second data string having a first predetermined value if all the bits of the corresponding data sub-string of the first data string have a second predetermined value and having a third predetermined value if any of the bits of the corresponding data sub-string of the first data string has other than the second predetermined value; starting from a predetermined end of the second data string, counting the number of consecutive bits of the second data spring having the first predetermined value; and dividing the said number by the number of bits in each data sub-string.

13 Claims, 8 Drawing Sheets

SCANNING ROUTE

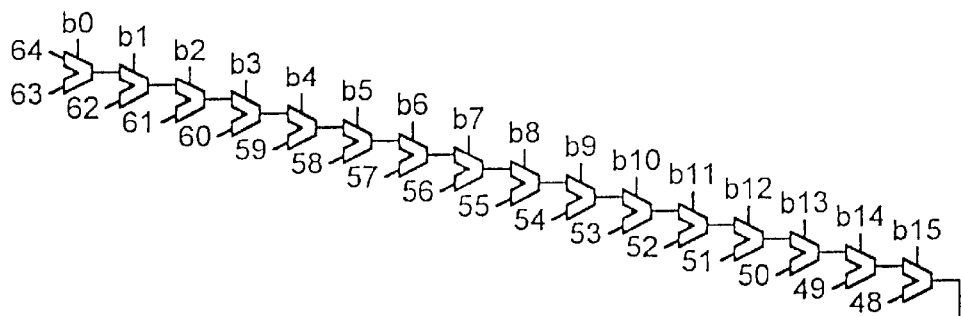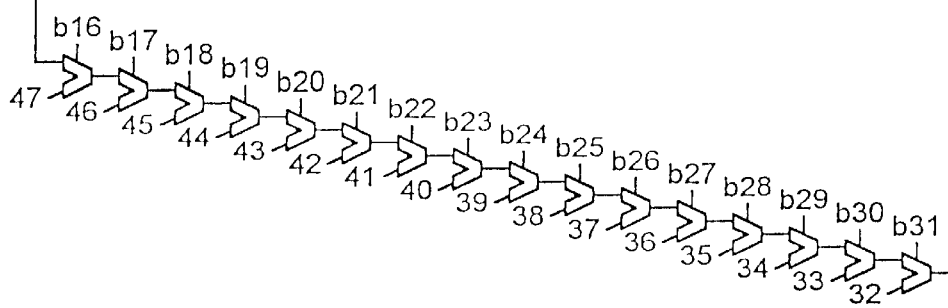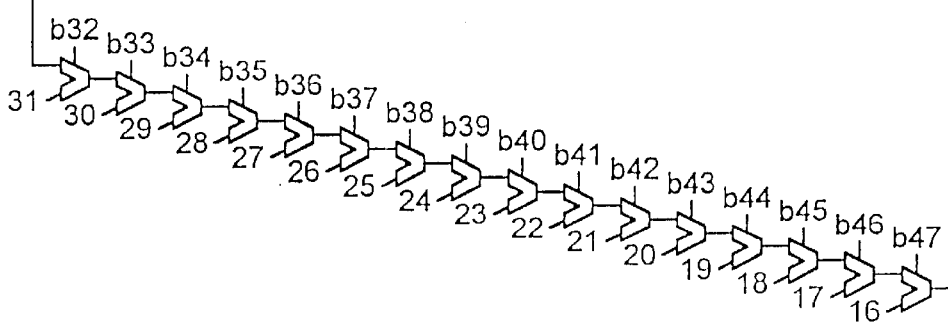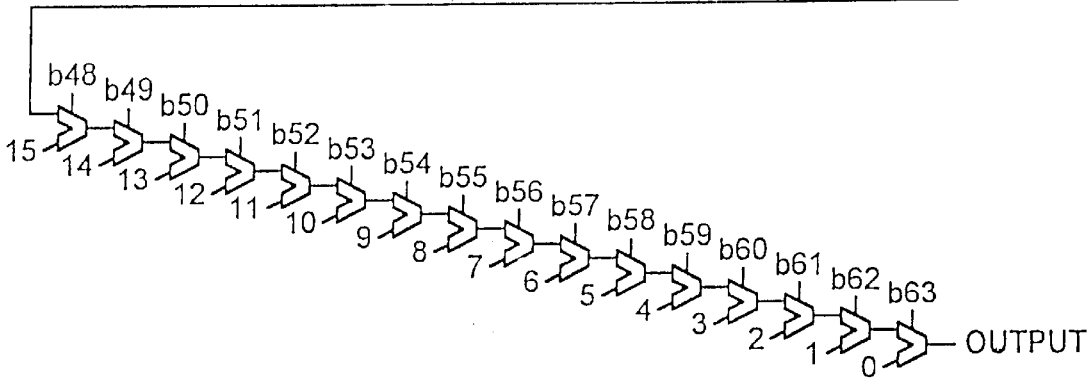
FIG 6

PACKED UNIT

OBVIOUS PACKED ARITHMETIC

FIG. 8
SYMBOLS

| SYMBOL | OPERATION |
|---|---|
| ▽ | ARITHMETIC LOGIC UNIT. COMBINES THE TWO SOURCE VALUES IN SOME MANNER TO PRODUCE A RESULT. |
| → \| R[3] \| R[2] \| R[1] \| R[0] \| → → → → ↑ | BUFFER. THIS PARTICULAR ONE HAS AN INPUT WHICH IS UNSEPARATED AND FOUR SEPARATED OUTPUTS, EACH TAKING ONE QUARTER OF THE INPUT SIGNALS, IT ALSO HAS AN OUTPUT ENABLE INPUT. |
| ▷ | MULTIPLEXER. THE OUTPUT CONSISTS OF ONE OF THE TWO INPUT SIGNALS. WHEN THE CONTROL SIGNAL IS NOT ASSERTED, THE UNSHADED INPUT SIGNAL IS OUTPUT. WHEN THE CONTROL SIGNAL IS ASSERTED, THE SHADED INPUT SIGNAL IS OUTPUT |
| ✕ | CHANGEOVER SWITCH. EACH OF THE TWO OUTPUTS CONSISTS OF ONE OF THE INPUT SIGNALS. WHEN THE CONTROL SIGNAL IS NOT ASSERTED, THE UNSHADED INPUT GOES TO THE UNSHADED OUTPUT AND THE SHADED INPUT GOES TO THE SHADED OUTPUT. WHEN THE CONTROL SIGNAL IS ASSERTED, THE OUTPUTS SWAP OVER. |

OBVIOUS PACKED ARITHMETIC WITH UNPACKED OPERAND

METHOD AND APPARATUS FOR RUN-LENGTH ENCODING DATA VALUES

BACKGROUND OF THE INVENTION

This invention relates to manipulating data, for example for encoding or decoding digital video signals.

It is becoming increasingly common for video signals to be transmitted or stored in a digital, rather than an analog, format. Digital video signals are usually compressed before transmission or storage (using a standard compression system such as MPEG-2, H.261 or H.263) and decompressed before playback. Several video compression standards use block-format video encoding, in which the pixels of the image to be compressed are split into blocks of adjacent pixels and each block is then compressed by a series of steps. This is efficient because most naturally-occurring images have areas which look fairly uniform and when compressing the image in this way the local uniformity reduces the amount of data needed to describe the image.

The first step of a typical block-format compression process is to split the image into smaller component blocks of adjacent pixels. Typically, the image is split into macroblocks (MBs), which consist of 256 pixels in a 16×16 array. The image in a macroblock is characterised by a luminance value (Y) for each pixel and two chrominance values (U and V) which in what is known as the 4:2:0 format (as used in many video compression standards), are each in an 8×8 array. Thus in this format each chrominance sampling point covers four luminance pixels (see FIG. 1). The main purpose of splitting the image in this way is to make the job of spatial compression easier; only a small section of the image needs to be examined, and so the task—although less efficient—is less complicated.

The technique usually used next is a discrete cosine transform (DCT). This works in much the same way as the Fourier transform, but in two dimensions on a set of pixels. Each coefficient in the DCT output represents a wave in the pixel domain, with the amplitude determined by the value of the coefficient, and the frequency in both dimensions determined by the position in the coefficient matrix. Moving to the right or the bottom of the DCT coefficient matrix increases the frequency of this wave. A superposition of a number of these waves leads to a reconstruction of the original image.

At this point, compression can begin on each DCTed luminance and chrominance matrix by removing some of the coefficients from the matrix, and quantising others. This leads to inaccuracies in the reconstituted image (lossy compression) but this is often acceptable, and the resulting matrix is easier to compress since it contains less information.

Another refinement to the compression process is the use of run-length encoding. This is a useful way of compressing sparse matrices. The technique involves thinking of the matrix as a long string of data, much as would be the case in a computer's memory. Run-length encoding (RLE) then describes that string as a number indicating the number of zero bytes (on in general the length of a series of zeroes), followed by a non-zero data element, followed by a number indicating the length of a series of zeroes, followed by a non-zero data element, and so on. (See FIG. 2).

To improve compression yet further, these RLE strings are Huffman-encoded. Huffman encoding consists of expressing some data item as a symbol—in this case, the number of zeroes (the run-length) followed by the data item. Huffman encoding relies on previous knowledge of the probability of occurrence of a particular symbol, such that the most likely symbols are encoded with fewer bits than the original, whereas the least likely symbols are encoded with more bits than the original. With sufficient knowledge of the likely data set, the number of bits required to represent that set are reduced, since the most frequently occurring symbols are represented in a small number of bits.

The success of a Huffman encoder relies on the predictability of its input data. In the example of the block of DCT coefficients outlined above, a raster scanning mechanism does not give particularly predictable data since the values tend to cluster in the top-left corner of the matrix (the low-frequency area). Thus scanning the first few lines will tend to give a data burst, followed by a few zeroes, followed by a slightly shorter data burst, followed by a few more zeroes, and so on. It is more efficient to group the non-zero data together, leading to a more predictable run-length, and so better Huffman compression. This is achieved by zigzag scanning, as illustrated in FIG. 3.

The zigzag scanned data is then Huffman encoded, so a simplified I-frame (spatial only) compression method could be summarised as the steps shown in FIG. 4.

In order to perform real-time video compression or decompression there is a need to perform these steps very quickly.

SUMMARY OF THE INVENTION

According to the present invention there is provided a method for run-length encoding two or more data values, the method comprising: loading the data values into storage by forming a first data string, the data string comprising a plurality of data sub-strings and each data sub-string representing at least one of the data values; generating a second data string having a data sub-string corresponding to each data sub-string of the first data string, all the bits of each of the data sub-strings of the second data string having a first predetermined value if all the bits of the corresponding data sub-string of the first data string have a second predetermined value and having a third predetermined value if any of the bits of the corresponding data sub-string of the first data string has other than the second predetermined value; starting from a predetermined end of the second data string, counting the number of consecutive bits of the second data spring having the first predetermined value; and dividing the said number by the number of bits in each data sub-string.

Preferably, the first predetermined value is zero. Preferably the second predetermined value is zero. Preferably the third predetermined value is one. Preferably the first and second values are equal.

The data strings are preferably of a predetermined length, for instance 32, 64 or 128 bits. The data-sub-strings in each data string are preferably of equal length, for instance 8, 16 or 32 bits. Each data string is suitably stored in a register in which, preferably, the sub-strings are not individually accessible or addressable. Preferably the data sub-strings all have the same length. All the data sub-strings are suitably at least two bits long.

Preferably some or all of the steps of the method are performed by executing one or more data processing instructions, suitably in a computer. The computer preferably has processing means, comprising one or more processors, and memory. The instructions are preferably capable of being executed by dedicated apparatus (software or hardware) in the computer. The memory preferably comprises a data memory for storing the data strings, most preferably in the form of registers in which the sub-strings are suitably not individually accessible, and program memory for storing a series of instructions for the processor (s) to execute the desired method. The processor(s) preferably include dedicated hardware and/or software for performing one or more of the instructions. The instructions may include an instruction to perform the said step of generating the second data string. The step of generating the second data string is preferably performed by executing an instruction to compare the first data string with a third data string all of whose bits are of the second predetermined value. The step of dividing is preferably performed by executing a bit shift instruction.

In a further step of the method, there is preferably a step of generating a fourth data string by masking the first data string with the second data string.

The method is preferably for data compression.

Other operations may be performed during the execution of the method.

Preferably the series of data values represents a matrix (suitably a square matrix) of data values. Preferably the number of the data values is a square number (or, if several series of data values are to be reordered, a whole multiple of a square number).

Preferably the data values represent data to be compressed. Preferably the data values represent data values to be encoded into a desired form, for example in a video compression apparatus. Preferably the data values represent video data, for instance luminance or chrominance information. The video data could relate to moving or still images.

The run-length encoding method may more generally be a method for data analysis. The analysis method is preferably part of a compression and/or encoding operation, for example video compression and/or encoding. Such compression or decompression is preferably as a precursor to Huffman encoding or the like and/or as a step following zigzag encoding or the like.

Some or all of steps and/or instructions of the method are suitably performed by a computer, suitably according to a stored program. The computer may be part of a compression and/or encoding system, preferably for sampled data and/or video data. The computer may be part of a communications transmission unit or a camera (especially a video camera).

BRIEF DESCRIPTION OF THE DRAWINGS

The present invention will now be described by way of example with reference to the accompanying drawings in which:

FIG. 6 illustrates the implementation of a clz8 instruction;

FIG. 8 shows the meaning of symbols used in the figures;

DETAILED DESCRIPTION OF THE PREFERRED EMBODIMENT

Figure 1:
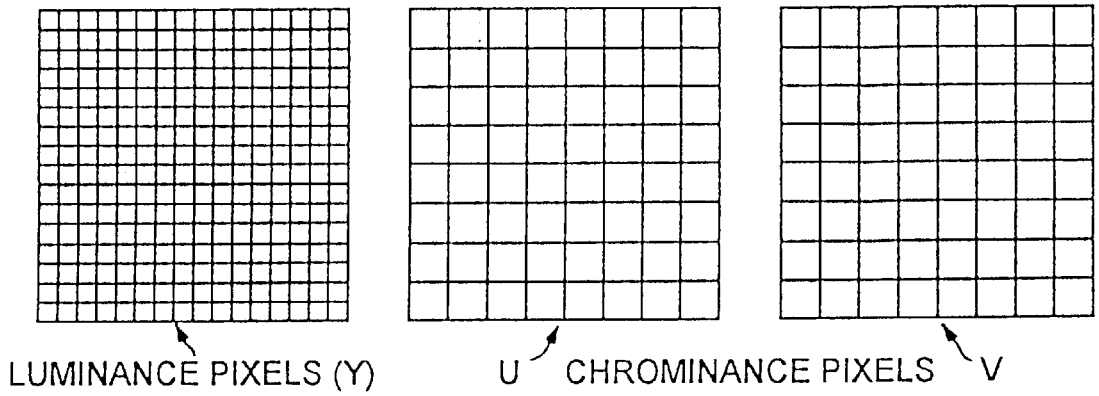
FIG. 1 illustrates luminance and chrominance pixels.
Figure 2:
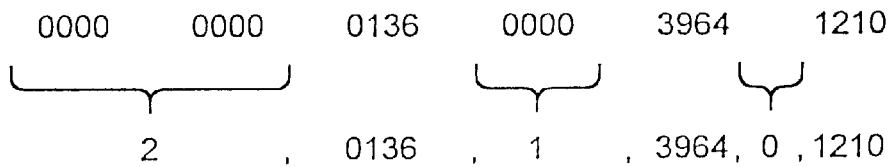
FIG. 2 illustrates an example of run-length encoding.
Figure 3:
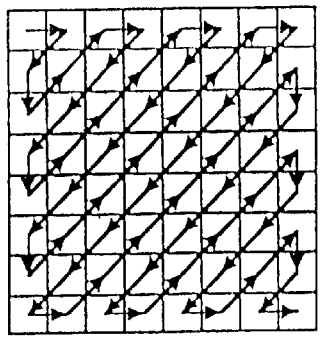
FIG. 3 illustrates zigzag scanning.
Figure 4:
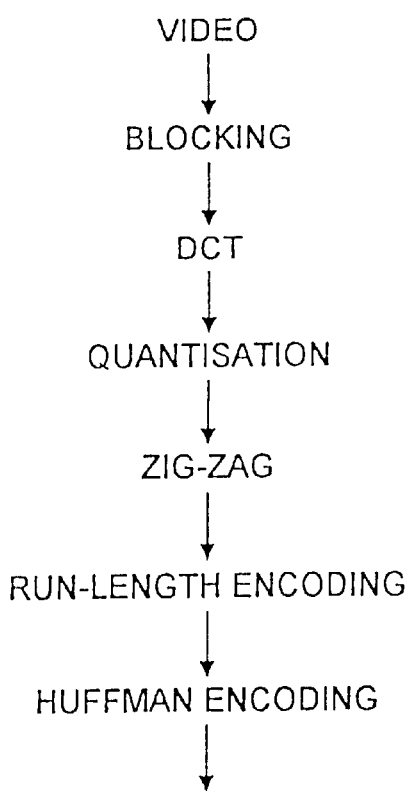
FIG. 4 illustrates the steps of a simplified I-frame compression method.
Figure 5:
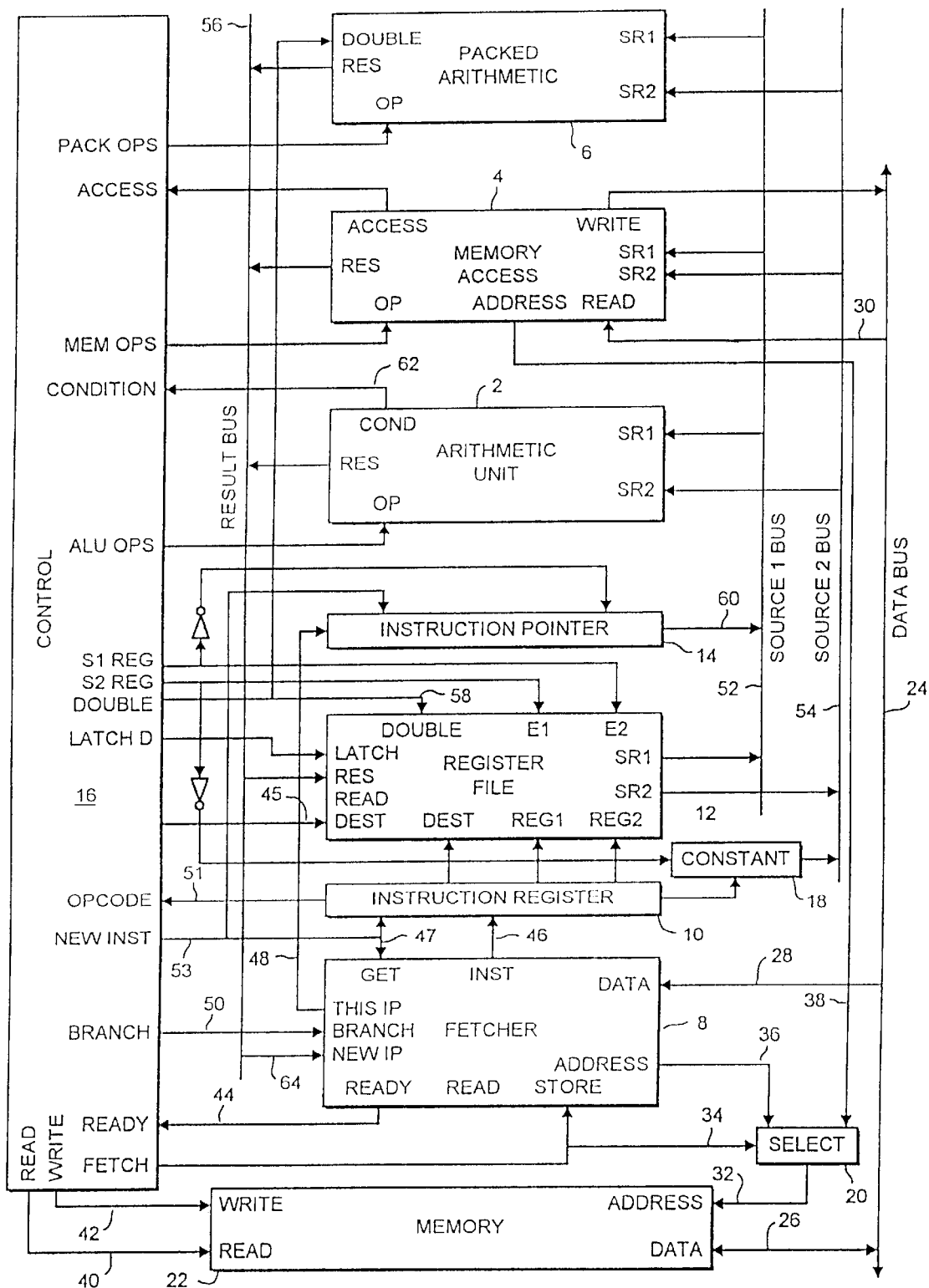
FIG. 5 is a block diagram of a processor and memory of a computer.

FIG. 5 shows a processor in accordance with one embodiment of the present invention. The processor has three execution units including a conventional arithmetic unit 2 and a memory access unit 4. In addition there is a packed arithmetic unit 6. The processor also includes an instruction fetcher 8, an instruction register 10, a register file 12 and an instruction pointer 14 all of which operate under the control of a control unit 16 of the processor. The register file comprises a set of registers each having a predetermined bit capacity and each being addressable with a single address. It is not possible to address individual locations within a register. When a register is accessed, the entire contents of the register are concerned. The processor further includes a constant unit 18 and a select unit 20. The constant unit 18 and select unit 20 are also operated under the control of the control unit 16. The processor operates in conjunction with a memory 22 which holds instructions and data values for effecting operations of the processor. Data values and instructions are supplied to and from the memory 22 via a data bus 24. The data bus 24 supplies data values to and from the memory 22 via a memory data input 26. The data bus 24 also supplies data to the instruction fetcher 8 via a fetcher data input 28 and to the memory access unit 4 via a memory access read input 30. The memory is addressed via the select unit 20 on address input 32. The select unit 20 is controlled via a fetch signal 34 from the control unit 16 to select an address 36 from the fetcher 8 or an address 38 from the memory access unit 4. Read and write control lines 40,42 from the control unit 16 control read and write operations to and from the memory 22. The instruction fetcher 8 fetches instructions from the memory 22 under the control of the control unit 16 as follows. An address 36 from which instructions are to be read is provided to the memory 22 via the select unit 20. These instructions are provided via the data bus 24 to the fetcher data input 28. When the instruction fetcher has fetched its next instruction, or in any event has a next instruction ready, it issues a Ready signal on line 44 to the control unit 16. The instruction which is to be executed is supplied to the instruction register 10 along instruction line Inst 46 and held there during its execution. The instruction pointer 14 holds the address of the instruction being executed supplied to it from the fetcher 8 via instruction pointer line 48. A Get signal 47 responsive to a New Inst signal 53 from the control unit 16 causes the instruction register 10 to store the next instruction on Inst line 46 and causes the fetcher 8 to prepare the next instruction. The New Inst signal 53 also causes the instruction pointer 14 to store the address of the next instruction. A branch line 50 from the control unit 16 allows the instruction fetcher 8 to execute branches.

The instruction register 10 provides Source 1 and Source 2 register addresses to the register file 12 as Reg1 and Reg2. A result register address is provided as Dest. Opcode is provided to the control unit 16 along line 51. In addition, some instructions will provide a constant operand instead of encoding one or both source registers. The constant is provided by the constant unit 18. The instruction's source values are provided on Source 1 and Source 2 buses 52,54 by the appropriate settings of the S1 Reg and S2 Reg signals at inputs E1,E2. The correct execution unit is enabled by providing the appropriate values for Pack Ops, Mem Ops and ALU Ops signals from the control unit 16 in accordance with the Opcode on line 51. The enabled unit will normally provide a result Res on a result bus 56. This is normally stored in the selected result register Dest in the register file 12. There are some exceptions to this.

Some instructions provide a Double length result. These store the first part of the result in the normal way. In a subsequent additional stage, the second part of the result is stored in the next register in the register file 12 by asserting a Double signal 58.

Branches 50 need to read and adjust the instruction pointer 14. These cause the S1 Reg signal not to be asserted, and so the instruction pointer 14 provides the Source 1 value on line 60. The Source 2 value is provided in the normal way (either from a register in the register file 12, or the constant unit 18). The arithmetic unit 2 executes the branch calculations and its result is stored into the fetcher 8 on the New IP input 64, rather than the register file 12, signalled by the Branch line 50 from the control unit 16. This starts the fetcher from a new address.

Conditional branches must execute in two stages depending on the state of condition line 62. The first stage uses the Dest Register as another source, by asserting a Read Dest signal 45. If the condition is satisfied, then the normal branch source operands are read and a branch is executed.

Calls must save a return address. This is done by storing the instruction pointer value in a destination register prior to calculating the branch target.

The computer described herein has several noteworthy general qualities.

Source operands are always the natural word length. There can be one, two or three source operands.

The result is always the natural word length, or twice the natural word length. There is a performance penalty when it is twice the natural word length as it takes an extra stage to store and occupies two, rather than one, registers. For this computer, assume a natural word length of 64 bits. That is, each register in the register file has a predetermined capacity of 64 bits.

The execution units 2,4,6 do not hold any state between instruction execution. Thus subsequent instructions are independent.

Non-Packed Instructions

The arithmetic unit 2 and memory access unit 4, along with the control unit 16 can execute the following. In the following definitions, a register is used to denote the contents of a register as well as a register itself as a storage location, in a manner familiar to a person skilled in the art.

| | |
|---|---|
| mov | Move a constant or a register into a register |
| add | Add two registers together and store the result in a third register (which could be the same as either of the sources) |
| sub | Subtract two registers and store the result in a third register |
| load | Use one register as an address and read from that location in memory, storing the result into another register |
| store | Use one register as an address and store the contents of another register into memory at the location specified by the address |
| cmpe | Compare two registers (or a register and a constant) for equality. If they are equal, store 1 into the destination register otherwise store zero |
| cmpge | Compare two registers (or a register and a constant) for orderability. If the second is not less than the first, store 1 into the destination register other wise store zero |
| jump | Unconditional jump to a new location |
| jumpz | Jump to a new program location, if the contents of a specified register is zero |
| jumpnz | Jump to a new program location, if the contents of a specified register is not zero |
| shr | Perform a bitwise right shift of a register by a constant or another register and store the result in a destination register. The shift is signed because the sign bit is duplicated when shifting |
| shl | Perform a bitwise left shift of a register by a constant or another register and store the result in a destination register |
| or/xor | Perform a bitwise logical operation (or/xor) on two registers and store result in destination register. |
| clz | Count the number of leading zeros in a register. FIG. 6 shows a suitable arrangemeht for implementing the clz instruction, taking as an example the clz8 instruction applied to a 64-bit input register. The functional blocks are all 2-bit multiplexers, with successive bits of the input register (indicated as "bxx", wit b0 being the least significant bit and b63 the most significant bit) being applied as the control signals. |

Packed Unit

Figure 7:
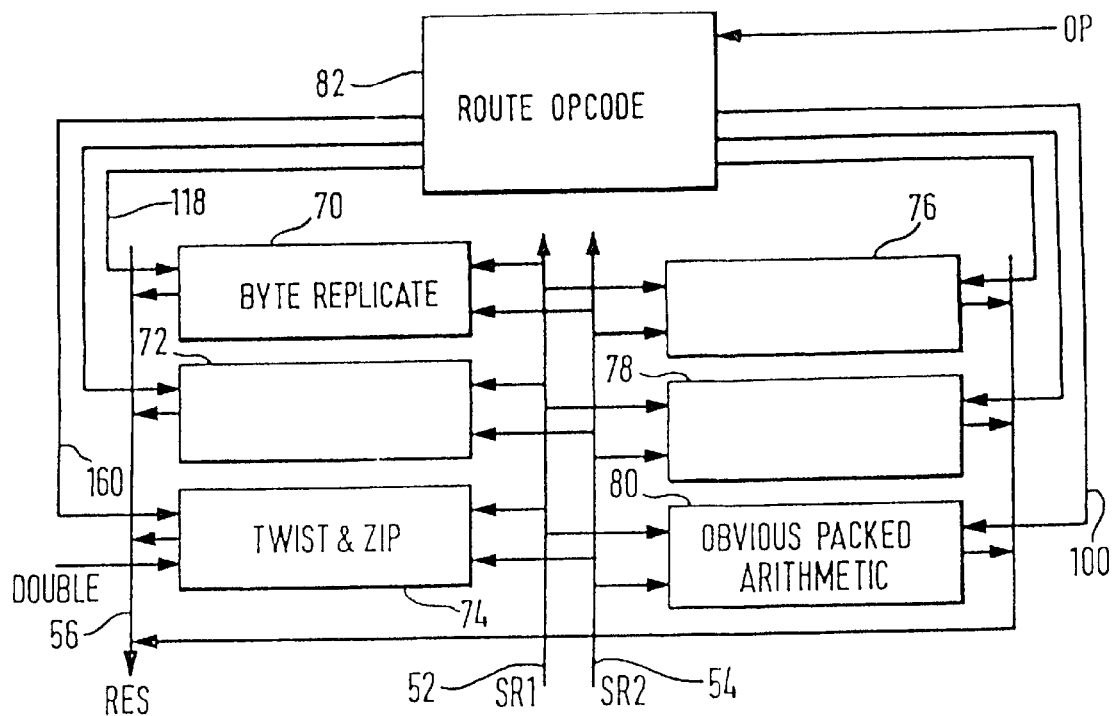
FIG. 7 is a block diagram of a packed arithmetic unit.

FIG. 7 shows in a block diagram the packed arithmetic unit 6. This is shown as a collection of separate units each responsible for some subset of packed arithmetic instructions. Another implementation could combine the functions in different ways. The units include a twiddle unit 72, an obvious packed arithmetic unit 80 and other packed arithmetic units 70, 74, 76, 78 not described herein. These are operated responsive to a route opcode unit 82 which selectively controls the arithmetic units 70 to 80. Operands for the arithmetic units 70 to 80 are supplied along the Source 1 and Source 2 buses 52,54. Results from the arithmetic units are supplied to the result bus 56. The op input to the route opcode unit 82 receives the Pack Ops instruction from the control unit 16 (FIG. 5). It will be appreciated that the operands supplied on the Source 1 and Source 2 buses are loaded into respective input buffers of the arithmetic units and the results supplied from one or two output buffers to one or two destination registers in the register file 12.

Obvious Packed Arithmetic

The obvious packed arithmetic unit 80 performs operations taking the two source operands as containing several packed objects each and operating on respective pairs of objects in the two operands to produce a result also containing the same number of packed objects as each source. The operations supported can be addition, subtraction, comparison, multiplication, left shift, right shift etc. As explained above, by addressing a register using a single address an operand will be accessed. The operand comprises a plurality of objects which cannot be individually addressed.

FIG. 8 shows the symbols used in the diagrams illustrating the arithmetic units of the packed arithmetic unit 6.

Figure 9:
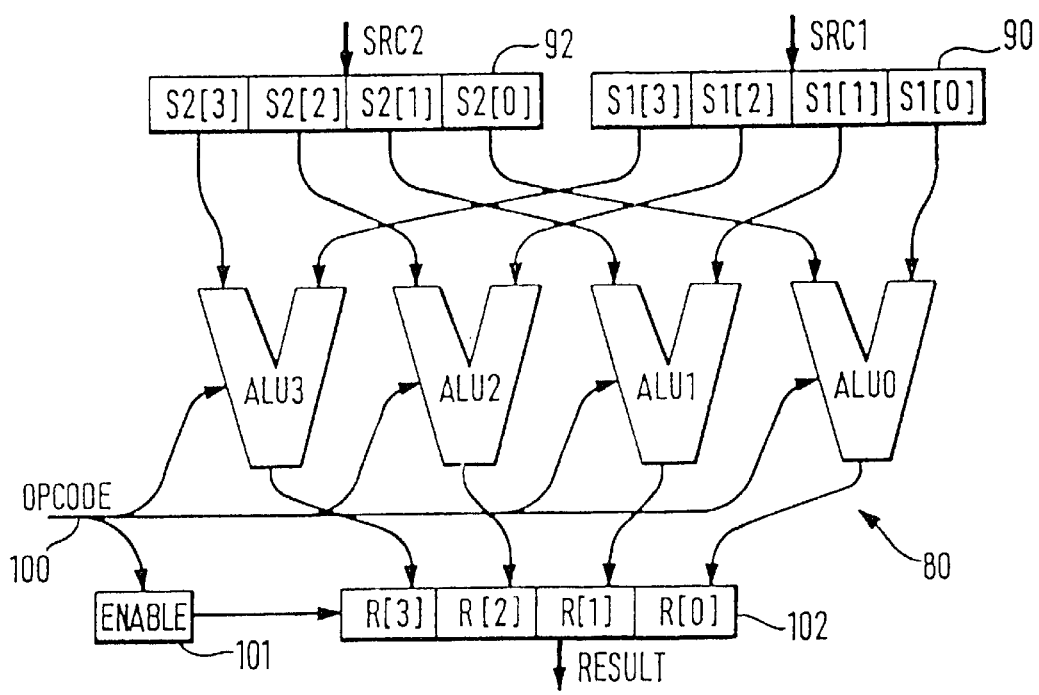
FIG. 9 is a block diagram of an obvious packed arithmetic unit operating on two packed source operands.

FIG. 9 shows an obvious packed arithmetic unit which can perform addition, subtraction, comparison and multiplication of packed 16 bit numbers. As, in this case, the source and result bus widths are 64 bit, there are four packed objects, each 16 bits long, on each bus.

The obvious packed arithmetic unit 80 comprises four arithmetic logical units ALU0–ALU3, each of which are controlled by opcode on line 100 which is derived form the route opcode unit 82 in FIG. 7. The 64 bit word supplied from source register 1 SRC1 contains four packed objects S1[0]–S1[3]. The 64 bit word supplied from source register 2 SRC2 contains four packed objects S2[0]–S2[3]. These are stored in first and second input buffers 90,92. The first arithmetic logic unit ALU0 operates on the first packed object in each operand, S1[0] and S2[0] to generate a result R[0]. The second to fourth arithmetic logic units ALU1–ALU3 similarly take the second to fourth pairs of objects and provide respective results R[1] to R[3]. These are stored in a result buffer 102. The result word thus contains four packed objects. An enable unit 101 determines if any of the unit should be active and controls whether the output buffer asserts its output.

The instructions are named as follows:

| | |
|---|---|
| add2p | Add each respective S1[i] to S2[i] as 2's complement numbers producing R[i]. Overflow is ignored. |
| sub2p | Subtract each respective S2[i] from S1[i] as 2's complement numbers producing R[i]. Overflow is ignored. |
| cmpe2p | Compare each respective S1[i] with S2[i]. If they are equal, set R[i] to all ones; if they are different, set R[i] to zero. |
| cmpne2p | Compare each respective S1[i] with S2[i]. If they are not equal, set R[i] to all ones; if they are different, set R[i] to zero. |
| cmpge2ps | Compare each respective S1[1] with S2[i] as signed 2's complement numbers. If S1[i] is greater than or equal to S2[i] set R[i] to all ones; if S1[i] is less than S2[i] set R[i] to zero. |
| mul2ps | Multiply each respective S1[i] by S2[i] as signed 2's complement numbers setting R[i] to the least significant 16 bits of the full (32 bit) product. |

Figure 10:
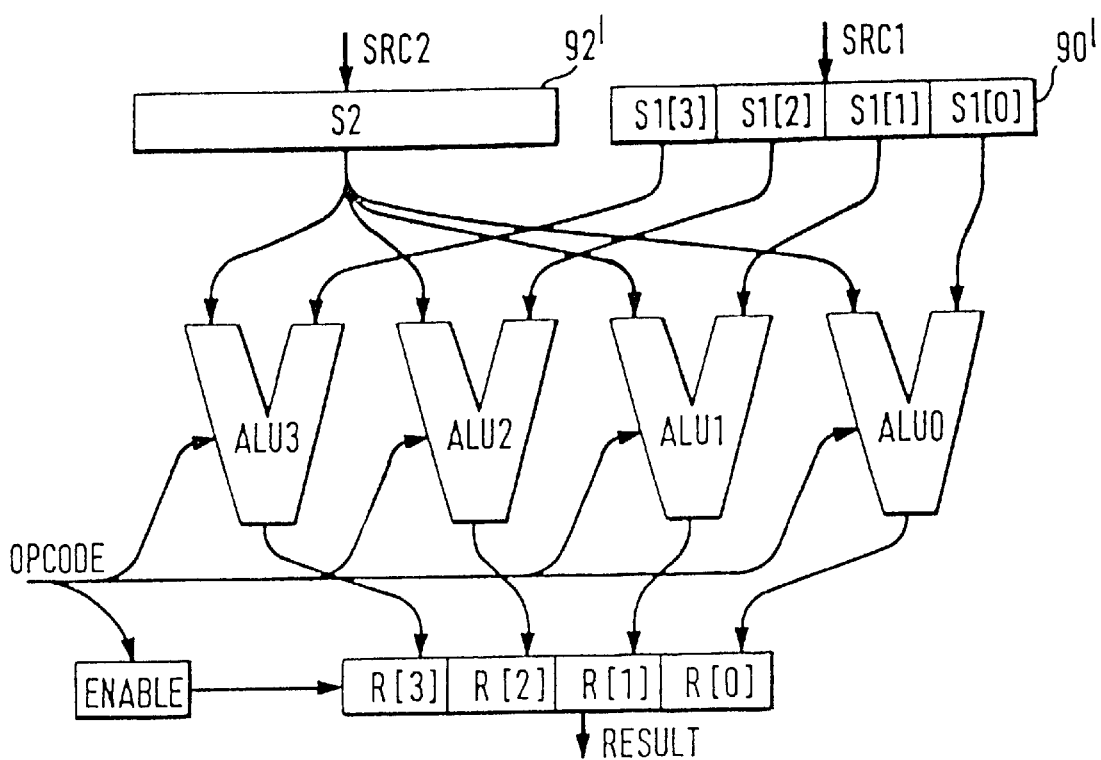
FIG. 10 is a block diagram of an obvious packed arithmetic unit which operates on a packed source operand and an unpacked source operand.

Some obvious packed arithmetic instructions naturally take one packed source operand and one unpacked source operand. FIG. 10 shows such a unit.

The contents of the packed arithmetic unit of FIG. 10 are substantially the same as that of FIG. 9. The only difference is that the input buffer 92' for the second source operand receives the source operand in unpacked form. The input buffer 92' receives the first source operand in packed form as before. One example of instructions using an unpacked source operand and a packed source operand are shift instructions, where the amount to shift by is not packed, so that the same shift can be applied to all the packed objects. Whilst it is not necessary for the shift amount to be unpacked, this is more useful.

| | |
|---|---|
| shl2p | Shift each respective S1[i] left by S2 (which is not packed), setting R[i] to the result. |
| shr2ps | Shift each respective S1[i] right by S2 (which is not packed, setting R[i] to the result. The shift is signed, because the sign bit is duplicated when shifting. |

It is assumed that the same set of operations are provided for packed 8 bit and packed 32 bit objects. The instructions have similar names, but replacing the "2" with a "1" or a "4".

Twiddle

Figure 11:
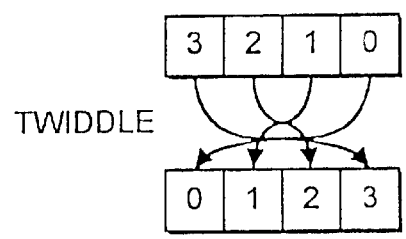
FIG. 11 shows a twiddle operation.

The twiddle unit 72 executes a twiddle instruction. This takes an object string and reverses the order of the objects from the object string to produce a single resultant string of the same length as the object string. This operation is illustrated, for the case of an object string (for instance of 64 bits) containing four objects (for instance each of 16 bits), in FIG. 11.

One advantageous application of the computer is in the field of data compression, especially in run-length encoding data as part of a compression algorithm such as MPEG-2.

As described above, the aim of run-length encoding is typically to estimate the length of a string of bits (of a series of input data values) having a certain value—usually zero. The estimated number is then used as a compressed representation of that string of zeros.

One way of implementing such a routine using the computer described above is to load each data value of a series of input data values into an object of a first register.

Then the cmpne ("compare not equal") instruction can be used to find the number of leading objects in that register all of whose bits are equal to the certain value. This can be done by providing as operands to the cmpne instruction the first register and another register (or pseudo-register) all of whose bits are set to the certain value; if the certain value is zero then the second operand would be a register in which all the objects were zero. This generates an output register in which each object indicates whether or not the corresponding object in the first register has all its bits of the certain value: if it does then the effect of the cmpne instruction is to set all the bits of the corresponding object in the output register to 0, otherwise all those bits are set to 1.

The clz instruction can then be used on the output register to count the number of leading zeros in it. When this is divided by the number of bits in the objects (by a shift operation) the result is the number of objects in the first register having all their bits set to the certain value. It should be noted that the number counted is not the length of a run of (typically) zero bits but the length of a run of (typically) zero objects. This provides efficient compression in a computer system of this type.

Figure 12:
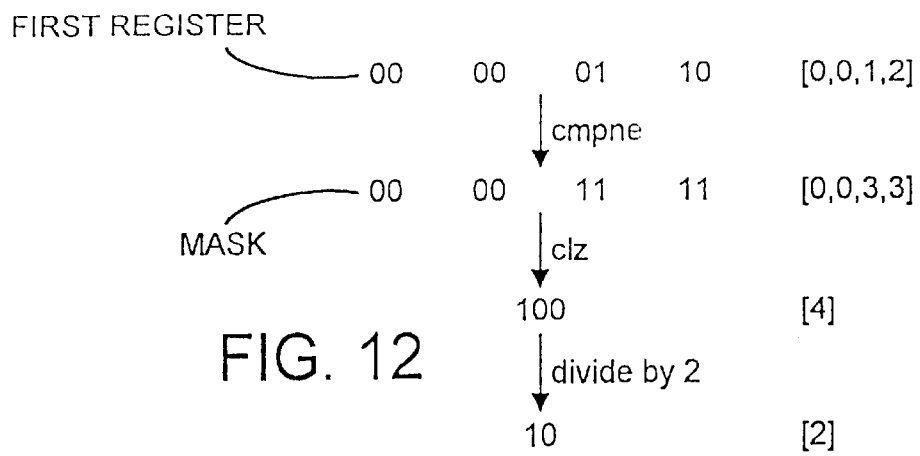
FIG. 12 illustrates a run-length encoding process.

As an example, FIG. 12 illustrates a 2-bit example of the process for a first register that stores four 2-bit data items in 2-bit objects. The figures in square brackets to the right of the binary representations show corresponding decimal representations.

The following code implements this operation for a 64-bit input register "reg" containing four 16-bit objects.

| | |
|---|---|
| reg = twiddle(reg, 0xc); | /* Reverse order of reg */ |
| mask = cmpne2p(reg, 0); | /* Compare not equal to zero */ |
| temp_counter = clz8(mask); | /* Count leading zeros */ |
| return(temp_counter >> 4); | /* Divide by 16 */ |

The twiddle instruction is needed to change the order of the data in reg. The control parameter 0xc causes it to reverse the order of the 16-bit elements in reg, placing the element with the lowest index in the array into the position at the MSB of the register. This is necessary only in little-endian memory systems.

Successive passes of this routine over a block of registers holding input data can be used to find each non-zero element.

In a further enhancement, the register "mask" defined in the above code can be used as a mask for the next stage in the run-length encoding procedure. This is illustrated by the following code.

```
/* Macro to store results from run-length encoding in a couple of arrays */
#define store_vlc(value, run_length, run_ptr, level_ptr)
{
    *run_ptr++ = run_length;
    *level_ptr++ = value;
}
/* Macro to run-length encode a register of 16-bit values */
#define rle_reg(reg,
previous_zeroes, TotalNumCoefs, run_ptr, level_ptr)
{
    TI8us reversed_reg, mask, this_mask, value;
    int NumCoefs, LeadingZeroes, TrailingZeroes;
    int i;
    reversed_reg = twiddle(reg, 0xc);
    mask = cmpne2p(reversed_reg, 0);
    NumCoefs =- (int) addacr2ps(mask);
    LeadingZeroes = 4;        /* In case of empty reg */
```

-continued

```
    for(i = 0; i < NumCoefs; i++)
    {
        LeadingZeroes = (int) clz8(mask);  /* In bits */
        TrailingZeroes = (48 - LeadingZeroes); /* In bits */
        this_mask = mask >> TrailingZeroes;
        this_mask <<= TrailingZeroes;  /* Mask off 1 word only */
        value = reversed_reg & this_mask;
        value >>= TrailingZeroes;
        LeadingZeroes >>= 4;        /* Now in words */
        TrailingZeroes >>= 4;       /* Now in words */
        store_vlc((int) value,
        LeadingZeroes + previous_zeroes,run_ptr, level_ptr);
        previous_zeroes = 0;        /* Now used */
    }
    previous_zeroes += TrailingZeroes;  /* Forward to next register */
    TotalNumCoefs += NumCoefs;
}
/* Routine to run-length encode a block of data */
/* Data should be passed in registers (hence macro definition) */
#define run_length_encode(r0, r1, r2, r3, r4, r5, r6, r7, r8,
                r9, r10, r11, r12, r13, r14, r15,
                run_ptr, level_ptr, NumCoefs)
{
    int trailing_zeroes = 0;
    rle_reg(r0, trailing_zeroes, NumCoefs, run_ptr, level_ptr);
    rle_reg(r1, trailing_zeroes, NumCoefs, run_ptr, level_ptr);
    rle_reg(r2, trailing_zeroes, NumCoefs, run_ptr, level_ptr);
    rle_reg(r3, trailing_zeroes, NumCoefs, run_ptr, level_ptr);
    rle_reg(r4, trailing_zeroes, NumCoefs, run_ptr, level_ptr);
    rle_reg(r5, trailing_zeroes, NumCoefs, run_ptr, level_ptr);
    rle_reg(r6, trailing_zeroes, NumCoefs, run_ptr, level_ptr);
    rle_reg(r7, trailing_zeroes, NumCoefs, run_ptr, level_ptr);
    rle_reg(r8, trailing_zeroes, NumCoefs, run_ptr, level_ptr);
    rle_reg(r9, trailing_zeroes, NumCoefs, run_ptr, level_ptr);
    rle_reg(r10, trailing_zeroes, NumCoefs, run_ptr, level_ptr);
    rle_reg(r11, trailing_zeroes, NumCoefs, run_ptr, level_ptr);
    rle_reg(r12, trailing_zeroes, NumCoefs, run_ptr, level_ptr);
    rle_reg(r13, trailing_zeroes, NumCoefs, run_ptr, level_ptr);
    rle_reg(r14, trailing_zeroes, NumCoefs, run_ptr, level_ptr);
    rle_reg(r15, trailing_zeroes, NumCoefs, run_ptr, level_ptr);
}
```

The macro "run_length_encode" performs run length encoding of a block of data by passing the registers r0 to r15 one-by-one to the macro "rle_reg" together with variables keeping count of the number of trailing zeros and numeric coefficients, and pointers.

The macro "rle_reg" performs run-length encoding on a register. First, it uses the instruction TI8us to define reversed_reg, mask, this_mask and value to be 64-bit registers. Then it uses the first two of the instructions already described above to reverse the contents of the input register and generate a mask register.

Figure 13:
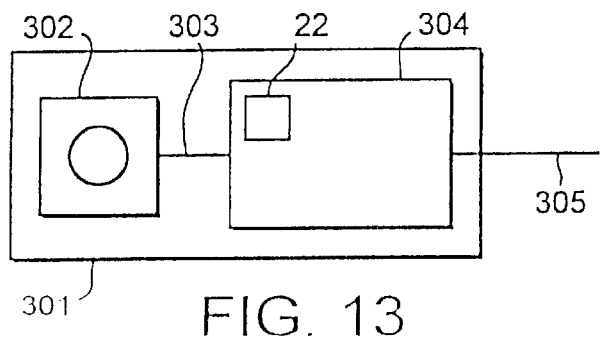
FIG. 13 shows generally the architecture of a set-top box.

In the video compression field the computer and the methods described above could advantageously be used in any appropriate apparatus for compressing video data. Examples are video cameras, video storage units, video recorders, video transmission units, video telephones, personal computers and data transmission units (for instance cellular telephone base-stations and data network apparatus such as internet apparatus). For example, FIG. 13 shows a suitable architecture for a video telephone 301 using such a computer. The telephone has a video camera 302 which generates a video feed at 303 to the computer described above, at 304, programmed with the run-length-encoding code set out above, which it holds in memory 22. This, compresses the data into an encoded format for onward transmission to the telephone network at 305.

The computer and the methods described above could advantageously be applied to other situations in which there is a need to analyse data, especially to find the run-lengths of sequences of bits.

The present invention may include any feature or combination of features disclosed herein either implicitly or explicitly or any generalisation thereof irrespective of whether it relates to the presently claimed invention. In view of the foregoing description it will be evident to a person skilled in the art that various modifications may be made within the scope of the invention.

What is claimed is:

1. A method for run-length encoding two or more data values, the method comprising:

loading the data values into storage by forming a first data string, comprising a plurality of data sub-strings, each data sub-string having a number of bits and representing at least one of the data values;

generating a second data string having a data sub-string corresponding to each data sub-string of the first data string, all the bits of each of the data sub-strings of the second data string having a first predetermined value if all the bits of the corresponding data sub-string of the first data string have a second predetermined value and having a third predetermined value if any of the bits of the corresponding data sub-string of the first data string has other than the second predetermined value;

starting from a predetermined end of the second data string, counting the number of consecutive bits of the second data string having the first predetermined value; and dividing the said number by the number of bits in each data sub-string.

2. A method as claimed in claim 1, wherein the first predetermined value is zero.

3. A method as claimed in claim 1, wherein all the data sub-strings have the same length.

4. A method as claimed in claim 1, wherein the second predetermined value is zero.

5. A method as claimed in claim 1, wherein all the data sub-strings are at least two bits long.

6. A method as claimed in claim 1, wherein the data values are loaded into a computer store in which the data sub-strings are not individually addressable.

7. A method as claimed in claim 1, wherein the step of generating the second data string is performed by executing an instruction to compare the first data string with a third data string all of whose bits are of the second predetermined value.

8. A method as claimed in claim 1, further comprising the step of generating a fourth data string by masking the first data string with the second data string.

9. A method as claimed in claim 1, wherein the step of dividing is performed by executing a bit shift.

10. A data compression method according to claim 1.

11. A computer comprising:

processing means for processing data strings;

a data memory for storing data strings, each data string comprising a plurality of data sub-strings; and a program memory for storing a series of instructions for the processing means to execute a method comprising steps according to claim 1.

12. A computer as claimed in claim 11, wherein the processing means includes dedicated apparatus for performing the step of generating the second data string.

13. The method of claim 1, wherein the recited steps are operable to compress data.

* * * * *

UNITED STATES PATENT AND TRADEMARK OFFICE
CERTIFICATE OF CORRECTION

| | | |
|---|---|---|
| PATENT NO. | : 6,737,993 B2 | Page 1 of 1 |
| APPLICATION NO. | : 10/143542 | |
| DATED | : May 18, 2004 | |
| INVENTOR(S) | : Victor Robert Watson | |

It is certified that error appears in the above-identified patent and that said Letters Patent is hereby corrected as shown below:

On the title page, item (73) should be blank

Signed and Sealed this

Eighteenth Day of December, 2012

David J. Kappos
*Director of the United States Patent and Trademark Office*